United States Patent [19]
Hastie

[11] Patent Number: 5,463,327
[45] Date of Patent: Oct. 31, 1995

[54] PROGRAMMABLE MULTIPLEXER LOGIC CELL

[75] Inventor: Neil S. Hastie, Plymouth, United Kingdom

[73] Assignee: Plessey Semiconductors Limited, Wiltshire, United Kingdom

[21] Appl. No.: 63,557

[22] Filed: May 19, 1993

[30] Foreign Application Priority Data

Jun. 2, 1992 [GB] United Kingdom ............... 9211681

[51] Int. Cl.[6] ............................ H03K 19/173
[52] U.S. Cl. ............................ 326/37; 326/39
[58] Field of Search ............... 307/465.9, 243; 326/37, 38, 39

[56] References Cited

U.S. PATENT DOCUMENTS

| | | | |
|---|---|---|---|
| 4,825,105 | 4/1989 | Holzle | 307/465 |
| 4,896,296 | 1/1990 | Turner | 307/465 |
| 5,027,011 | 6/1991 | Steele | 307/465 |
| 5,055,718 | 10/1991 | Galbraith | 307/465 |
| 5,220,213 | 6/1993 | Chan | 307/465 |

OTHER PUBLICATIONS

Perry, S., "Scottish Research Sets New Computing Trend" New Electronic Incorporating Electronics Today, vol. 22, No. 10, Dec. 1989, London, Great Britain, pp. 17–18.

Primary Examiner—Edward P. Westin
Assistant Examiner—Andrew Sanders
Attorney, Agent, or Firm—Spencer, Frank & Schneider

[57] ABSTRACT

A programmable logic cell suitable for use in a programmable gate array and able to produce any logical function of two inputs, operate as a 2 to 1 multiplexor or a data latch is formed by four multiplexors, five inverters and an OR gate to provide a very fast programmable logic cell.

16 Claims, 1 Drawing Sheet

PROGRAMMABLE MULTIPLEXER LOGIC CELL

FIELD OF THE INVENTION

This invention provides a programmable logic cell, and in particular a programmable logic cell for use in a programmable gate array.

DESCRIPTION OF THE PRIOR ART

Programmable gate arrays comprise a large number of programmable logic cells linked together by a routing network.

A programmable logic cell is able to carry out a number of different logic functions on its inputs, and is programmed after manufacture to carry out a particular one of these possible functions.

A problem with such logic cells is that if they carry out complex logic functions the time delay between data input and output can become quite significant and this can be a problem, particularly in programmable gate arrays where data will generally be routed in series through a large number of programmable logic cells.

An example of this are the programmable logic cells disclosed in our co-pending patent application Ser. No. 08/068200, in order to allow complex logical functions to be generated they must use XOR gates, increasing their time delay significantly due to the inherent slowness of such gates.

BRIEF SUMMARY OF THE INVENTION

This invention was intended to produce a programmable logic cell able to carry out a wide range of complex logic functions while having a relatively short delay time.

This invention provides a programmable logic cell comprises first, second and third multiplexors each having a plurality of inputs and a single output and being controlled by a control signal and a fourth 2 to 1 multiplexor controlled by the output of the first multiplexor, the fourth multiplexor having the outputs of the second and third multiplexors as its two inputs and the output of the fourth multiplexor providing the output of the logic cell.

This provides the advantage that because only multiplexors and inverters are used, and one OR gate for latch functions, the programmable logic gate has a very short delay betwen data input and data output, particularly compared to a system using XOR gates.

It has been realised that any possible logical function of two inputs may be produced by using a 2 to 1 multiplexor with selective input inversion. For example, consider the signals X and Y and a 2 to 1 multiplexor producing the function $F=(A \cdot C)+(B \cdot C \text{ bar})$ to produce the function $F=X \cdot Y$ the multiplexor connections required are as follows:

let $A=X$ $B=Y$ $C=X$ bar then $F=(X \cdot X \text{ bar})+(Y \cdot X)=0+Y \cdot X=X \cdot Y$ To produce the functions $F=X+Y$ the multiplexor connections required are as follows:

let $A=X$ $B=Y$ $C=X$ then $F=(X \cdot X)+(Y \cdot X \text{ bar})=X+Y \cdot X \text{ bar}=X+Y$ This can be extended to produce any function of two inputs.

BRIEF DESCRIPTION OF THE DRAWINGS

A system embodying this invention will now be described by way of example only with reference to the accompanying diagrammatic figure in which.

DETAILED DESCRIPTION

Figure 1:
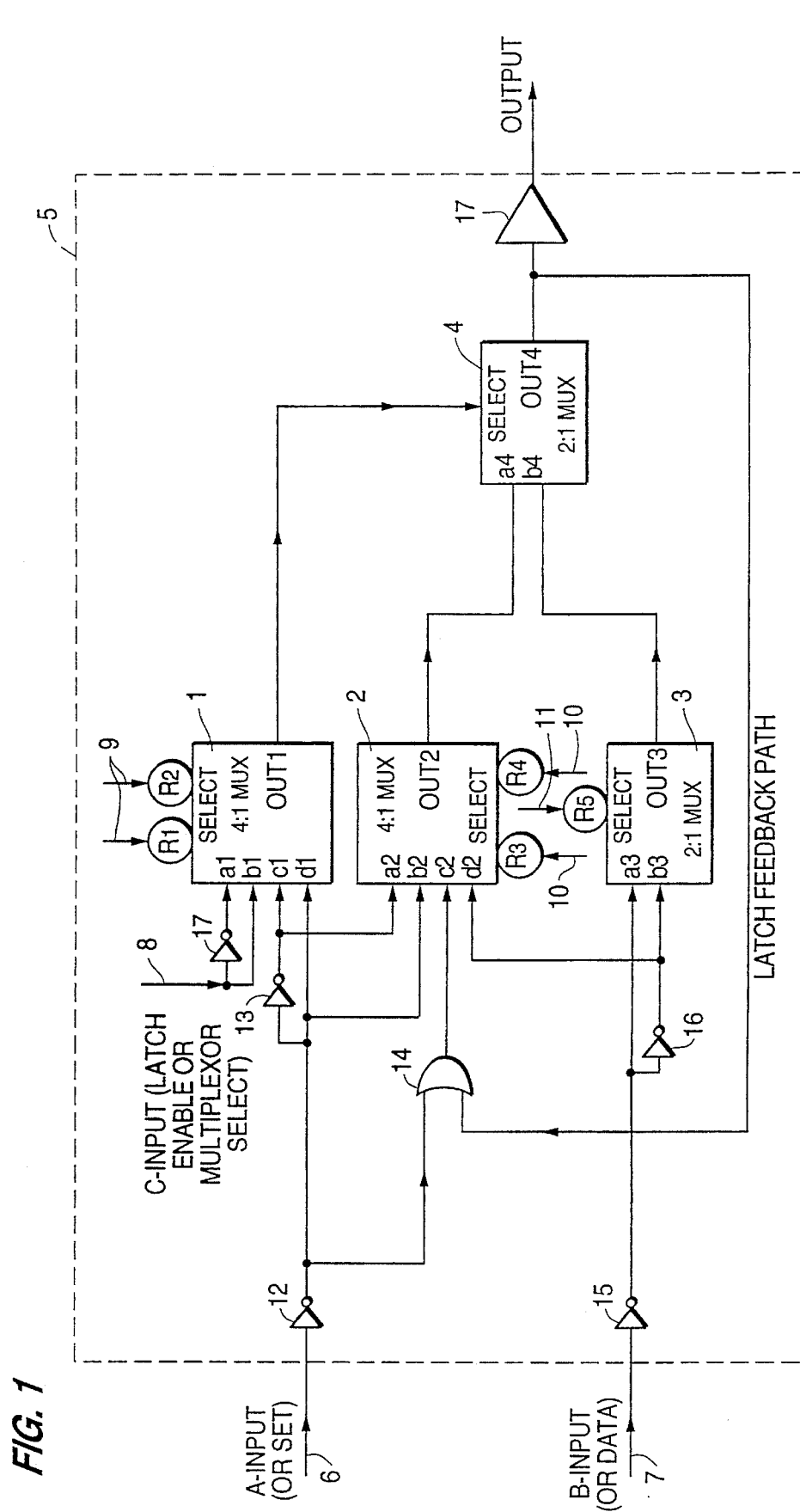
FIG. 1 shows a programmable logic cell employing the invention.

FIG. 1 shows a logic cell 5 based on this principle and arranged to produce from two inputs any logical function of the two inputs, a data latch with set and a 2 to 1 multiplexor. The function actually carried out being selected by external programming means.

The logic cell 5 comprises an A input 6, a B input 7 and a C input 8. These inputs are supplied to three multiplexors 1,2 and 3 which are controlled by external programming means (not shown), while the outputs of the three multiplexors 1 to 3 are supplied to a 2 to 1 multiplexor 4.

The multiplexor 1 is a 4 to 1 multiplexor having inputs A1, B1, C1, D1 and an output out 1 and is controlled by a two bit control signal R1, R2, on control lines 9. The multiplexor 2 is a 4 to 1 multiplexor with inputs A2, B2, C2 and D2 and an output out 2 and is controlled by a two bit control signal R3, R4 along lines 10. The multiplexor 3 is a 2 to 1 multiplexor with inputs A3, B3, and an output out 3 and is controlled by a one bit control signal R5 along control line 11. The 2 to 1 multiplexor 4 is arranged such that a logical 1 from the output of the multiplexor 1 will switch its input A4, which is the output (out 2) of multiplexor 2 to its output (out 4) while a logical 0 from the multiplexor 1 will switch input B4 which is the output (out 3) of the 2 to 1 multiplexor 3 to its output (out 4).

The inputs to the three multiplexors 1,2 and 3 are provided as follows. The A input 6 passes through an inverter 12 and the output of the inverter 12 is linked directly to the D1 input of multiplexor 1 and the B2 input of the multiplexor 2. The output of the inverter 12 is also passed through an inverter 13 to the C1 input of the multiplexor 1 and the A2 input of the multiplexor 2. The output of the inverter 12 is also supplied to one input of an OR gate 14.

The B input 7 is supplied to an inverter 15 and the output of the inverter 15 is passed into the A3 input of the multiplexor 3 and is also supplied to an inverter 16. The output of the inverter 16 is supplied to the B3 input of the multiplexor 3 and the D2 input of the multiplexor 2.

The C input on line 8 is supplied to the B1 input of the multiplexor 1 and to an inverter 17. The output of the inverter 17 is supplied to the A1 input of the multiplexor 1.

In order to provide a feed back path for a latch function the output of the 2 to 1 multiplexor 4 is passed back to the second input of the OR gate 14 and the output of this OR gate 14 is supplied to the C2 input of the multiplexor 2.

The output from the 2 to 1 multiplexor 4 is passed through an amplifier 17 to provide the output of the logic cell.

The multiplexor connections for multiplexors 1,2 and 3 required for simple logical functions of the two inputs A and B are shown in table 1, for each of the functions this shows which input of multiplexors 1,2 and 3 must be connected to their respective outputs.

To provide these simple logical functions no control C input along line 8 is required and signals along line 8 will not effect the output.

To allow the logic cell to operate as a multiplexor a third control C input along input line 8 is necessary to act as a control input, the necessary multiplexor settings for the available multiplexor functions are shown in Table 2.

When the logic cell operates as a latch the A input along line 6 is the set signal while the B input along line 7 is the data signal and the C input along line 8 is the enable signal, the multiplexor settings for the various latch functions are shown in FIG. 3.

It may be desired to produce-functions of a single input from the logic cell and in order to do this a connection between the A and B inputs on lines 6 and 7 must be provided outside the cell, such a connection is not shown in FIG. 1 but can easily be made. The various single input functions, the required multiplexor settings and whether input A should be connected to input B or vice versa are set out in Table 4.

Since this logic cell uses only multiplexors and inverters and a single OR gate, it is quick even though it is capable of a wide range of complex functions.

The programmable logic cell is intended for use in a programmable gate array and is particularly suitable for use in any field programmable gate array.

The control signals used to set the multiplexors can be provided from a RAM memory, in which case the programming of the logic cell can be altered or could be provided in some other way such as a fuse or antifuse permanent programming system.

Any type of multiplexor can be used but it is preferred to use multiplexors of the type disclosed in our co-pending patent application Ser. No. 08/068,200, the teaching of which is incorporated herein by way of reference.

TABLE 1

| Function | Out1 = | Out2 = | Out3 = |
| --- | --- | --- | --- |
| A.B. | d1 | a2 | b3 |
| Abar.B | c1 | b2 | b3 |
| A.Bbar | d1 | a2 | a3 |
| Abar.Bbar | c1 | b2 | a3 |
| A+B | c1 | a2 | b3 |
| Abar+B | d1 | b2 | b3 |
| A+Bbar | c1 | a2 | a3 |
| Abar+Bbar | d1 | b2 | a3 |
| AexorB | d1 | d2 | a3 |
| AexnorB | c1 | d2 | a3 |

TABLE 2

| Function | Out1 = | Out2 = | Out3 = |
| --- | --- | --- | --- |
| A.C+B.Cbar | b1 | a2 | b3 |
| A.Cbar+B.C | a1 | a2 | b3 |
| Abar.C+B.Cbar | b1 | b2 | b3 |
| Abar.Cbar+B.C | a1 | b2 | b3 |
| A.C+Bbar.Cbar | b1 | a2 | a3 |
| A.Cbar+Bbar.C | a1 | a2 | a3 |
| Abar.C+Bbar.Cbar | b1 | b2 | a3 |
| Abar.Cbar+Bbar.C | a1 | b2 | a3 |

TABLE 3

| Function | Out1 = | Out2 = | Out3 = |
| --- | --- | --- | --- |
| B.C+(F+Abar).Cbar | a1 | c2 | b3 |
| B.Cbar+(F+Abar).C | b1 | c2 | b3 |
| Bbar.C+(F+Abar).Cbar | a1 | c2 | a3 |
| Bbar.Cbar+(F+Abar).C | b1 | c2 | a3 |

TABLE 4

| A | Connect A to B | Cell function A.B |
| --- | --- | --- |
| Abar | Connect A to B | Cell function Abar.Bbar |
| B | Connect B to A | Cell function A.B |
| Bbar | Connect B to A | Cell function Abar.Bbar |
| Logical1 | Connect B to A | Cell function AexnorB |
| Logical0 | Connect B to A | Cell function AexorB |

I claim:

1. A programmable logic cell having first and second inputs and comprising first and second 4 to 1 multiplexors and third and fourth 2 to 1 multiplexors each having a plurality of inputs and a single output and being controlled by a respective control signal; and wherein: the fourth 2 to 1 multiplexor is controlled by the output of the first multiplexor; the fourth multiplexor ha the outputs of the second and third multiplexors as its two inputs; the output of the fourth multiplexor provides the output of the logic cell; the first input of the logic cell is connected via an invertor to (1) a fourth input of the first multiplexor, (2) a second input of the second multiplexor, (3) a third input of the first multiplexor and a first input of the second multiplexor via a further invertor, and (4) a third input of the second multiplexor; and the second input of the logic cell is connected via an invertor to (1) a first input of the third multiplexor, and (2) to a fourth input of the second multiplexor and a second input of the third multiplexor via another inverter.

2. A programmable logic cell as claimed in claim 1 wherein the logic cell has a third input connected to a second input of the first multiplexor and via an inverter to a first input of the first multiplexor.

3. A programmable logic cell as claimed in claim 2 further comprising an OR-gate having its ouput connected to the third input of the second multiplexor and one input connected to the output of the fourth multiplexor; and wherein the first input of the logic cell is connected via the inverter to the third input of the second multiplexor by being connected to a further input of the OR-gate.

4. A programmable logic cell as claimed in claim 1 further comprising an OR-gate having its output connected to the third input of the second multiplexor and one input connected to the output of the fourth multiplexor; and wherein the first input of the logic cell is connected via the inverter to the third input of the second multiplexor by being connected to a further input of the OR-gate.

5. A programmable logic cell having first and second inputs, and further comprising:

first and second 4 to 1 multiplexors and third and fourth 2 to 1 multiplexors, each having a plurality of inputs and a single output and being controlled by a respective control signal, with the fourth 2 to 1 multiplexor being controlled by the output of the first multiplexor, the fourth multiplexor having the outputs of the second and third multiplexors as its two inputs, and the output of the fourth multiplexor providing the output of the logic cell;

first circuit means for connecting the first input of the logic cell to the inputs of the first and second multiplexors to feed a signal at the first input of the logic cell to a third input of the first multiplexor and a first input of the second multiplexor, and to invert and feed a signal at the first input of the logic cell to a fourth input of the first multiplexor and to second and third inputs of the second multiplexor; and, second circuit means for connecting the second input of the logic cell to the inputs of the second and third multiplexors to feed a signal at the second input of the logic cell to a fourth input of the second multiplexor and a second input of the third multiplexor, and to invert and feed a signal at the second input of the logic cell to a first input of the third multiplexor.

6. A programmable logic cell as claimed in claim 5 further comprising: a third input for the logic cell; and third circuit means for connecting the third input of the logic cell to first and second inputs of the first multiplexor to feed a signal at the third input to one of the first and second inputs of the first multiplexor and an inverted version of the signal at the third input of the logic cell to the other of the first and second inputs of the first multiplexor.

7. A programmable logic cell as claimed in claim 6 wherein said first circuit means includes an OR-gate having its output connected to the third input of the second multiplexor and a first input connected to the first input of the cell via an inverter; and further comprising means connecting the output of the fourth multiplexor to a second input of the OR-gate.

8. A programmable logic cell as claimed in claim 5 wherein said first circuit means includes an OR-gate having its output connected to the third input of the second multiplexor and a first input connected to the first input of the logic cell via an inverter; and further comprising means connecting the output of the fourth multiplexor to a second input of the OR-gate.

9. A programmable logic cell having first and second inputs and an output and comprising: first and second multiplexors each having first to fourth inputs, a control signal input and an output; third and fourth multiplexors each having first and second inputs, a control signal input and an output; means connecting the first input of the logic cell via a first invertor to the fourth input of the first multiplexor, to the second input of the second multiplexor, via a second invertor to the third input of the first multiplexor and to the first input of the second multiplexor, and to a third input of the second multiplexor; means connecting the second input of the logic cell via a third invertor to the first input of the third multiplexor and via a fourth invertor to the fourth input of the second multiplexor and to the second input of the third multiplexor; means connecting the output of the first multiplexor to the control signal input of the fourth multiplexor; means connecting the outputs of the second and third multiplexors to the first and second inputs of the fourth multiplexor respectively; and means connecting the output of the fourth multiplexor to the output of the logic cell.

10. A programmable logic cell as claimed in claim 9 wherein the logic cell has a third input connected to the second input of the first multiplexor and via a fifth invertor to the first input of the first multiplexor.

11. A programmable logic cell as claimed in claim 10 wherein the means connecting the first input includes an OR-gate having its output connected to the third input of the second multiplexor and one input connected to the output of the fourth multiplexor, with the first input of the logic cell being connected via the first invertor to the third input of the second multiplexor by being connected to a further input of the OR-gate.

12. A programmable logic cell as claimed in claim 9 wherein the means connecting the first input includes an OR-gate having its output connected to the third input of the second multiplexor and one input connected to the output of the fourth multiplexor, and the first input of the logic cell is connected via the first invertor to the third input of the second multiplexor by being connected to a further input of the OR-gate.

13. A programmable logic cell having first and second inputs and an output and comprising: first and second multiplexors each having first to fourth inputs, a control signal input and an output; third and fourth multiplexors each having first and second inputs, a control signal input and an output, first circuit means for connecting the first input of the logic cell to the first and second multiplexors to feed a signal at the first input of the logic cell to the third input of the first multiplexor and to the first input of the second multiplexor and to invert and feed a signal at the first input of the logic cell to the fourth input of the first multiplexor and to the second and third inputs of the second multiplexor; second circuit means for connecting the second input of the logic cell to the second and third multiplexors to feed a signal at the second input of the logic cell to the fourth input of the second multiplexor and to the second input of the third multiplexor, and to invert and feed a signal at the second input of the logic cell to the first input of the third multiplexor, means connecting the output of the first multiplexor to the control signal input of the fourth multiplexor; means connecting the outputs of the second and third multiplexors to the first and second inputs of the fourth multiplexor, respectively, and means connecting the output of the fourth multiplexor to the output of the logic cell.

14. A programmable logic cell as claimed in claim 13 having a third input, and further comprising third circuit means for connecting the third input of the logic cell to first and second inputs of the first multiplexor to feed a signal at the third input of the logic cell to one of the first and second inputs of the first multiplexor and to invert and feed the signal at the third input of the logic cell to the other of the first and second inputs of the first multiplexor.

15. A programmable logic cell as claimed in claim 14 wherein said first circuit means includes an OR-gate having its output connected to the third input of the second multiplexor, and means connecting the first input of the logic cell to a first input of the OR-gate via an invertor; and further comprising means connecting the output of the fourth multiplexor to a second input of the OR-gate.

16. A programmable logic cell as claimed in claim 13 wherein said first circuit means includes an OR-gate having its output connected to the third input of the second multiplexor, and means connecting the first input of the logic cell to the first input of the OR-gate via an invertor; and further comprising means connecting the output of the fourth multiplexor to a second input of the OR-gate.

* * * * *